(12) United States Patent
Ardisana, II et al.

(10) Patent No.: US 11,670,805 B2
(45) Date of Patent: Jun. 6, 2023

(54) NESTED PCM BATTERY PACK

(71) Applicant: Snap Inc., Santa Monica, CA (US)

(72) Inventors: John Bernard Ardisana, II, Torrance, CA (US); Yoav Ben-Haim, Venice, CA (US); Teodor Dabov, Los Angeles, CA (US); Douglas Wayne Moskowitz, Marina Del Rey, CA (US)

(73) Assignee: Snap Inc., Santa Monica, CA (US)

( * ) Notice: Subject to any disclaimer, the term of this patent is extended or adjusted under 35 U.S.C. 154(b) by 0 days.

(21) Appl. No.: 16/143,029

(22) Filed: Sep. 26, 2018

(65) Prior Publication Data

US 2019/0131664 A1    May 2, 2019

Related U.S. Application Data

(60) Provisional application No. 62/579,604, filed on Oct. 31, 2017, provisional application No. 62/579,615, filed on Oct. 31, 2017.

(51) Int. Cl.
| | |
|---|---|
| *H01M 10/42* | (2006.01) |
| *H05K 1/18* | (2006.01) |
| *H05K 3/32* | (2006.01) |
| *H01M 50/209* | (2021.01) |

(Continued)

(52) U.S. Cl.
CPC ..... *H01M 10/425* (2013.01); *H01M 10/4207* (2013.01); *H01M 50/209* (2021.01); *H01M 50/519* (2021.01); *H01M 50/557* (2021.01); *H05K 1/181* (2013.01); *H05K 3/32* (2013.01); *H01M 2010/4271* (2013.01); *H05K 2201/10037* (2013.01); *H05K 2203/166* (2013.01)

(58) Field of Classification Search
CPC ........... H01M 10/425; H01M 10/4207; H01M 2/0212; H01M 2/1061; H01M 2/202
See application file for complete search history.

(56) References Cited

U.S. PATENT DOCUMENTS

| | | |
|---|---|---|
| 9,711,799 B1 * | 7/2017 | Lai ........................... C25D 1/04 |
| 11,515,575 B2 | 11/2022 | Ardisana, II et al. |
| 2003/0146734 A1 | 8/2003 | Masui et al. |

(Continued)

FOREIGN PATENT DOCUMENTS

| | | |
|---|---|---|
| CN | 1416599 | 5/2003 |
| CN | 1508892 | 6/2004 |

(Continued)

OTHER PUBLICATIONS

"U.S. Appl. No. 16/142,885, Non Final Office Action dated Mar. 20, 2020", 7 pgs.

(Continued)

*Primary Examiner* — Jimmy Vo
(74) *Attorney, Agent, or Firm* — Schwegman Lundberg & Woessner, P.A.

(57) ABSTRACT

A battery pack comprises a pair of physically separate battery cells share a single protection circuit module (PCM). Each further saw comprises a respective pair of electrodes, with both pairs of electrodes being connected to a single, common protection circuit board (PCB) of the PCM. The common PCM may be located in a spacing between adjacent ends of the batteries such that a widthwise dimension of the PCB has an upright orientation between the two batteries.

5 Claims, 6 Drawing Sheets

(51) Int. Cl.
*H01M 50/557* (2021.01)
*H01M 50/519* (2021.01)

(56) References Cited

U.S. PATENT DOCUMENTS

| | | |
|---|---|---|
| 2004/0119442 A1 | 6/2004 | Lee et al. |
| 2007/0231682 A1 | 10/2007 | Aoyama et al. |
| 2008/0176131 A1 | 7/2008 | Seo et al. |
| 2009/0297942 A1 | 12/2009 | Jang et al. |
| 2010/0112425 A1 | 5/2010 | Dunn |
| 2012/0121936 A1 | 5/2012 | Baek et al. |
| 2012/0308849 A1* | 12/2012 | Tortstensson ....... H01M 2/1072 429/7 |
| 2013/0149562 A1 | 6/2013 | Lee et al. |
| 2015/0223320 A1 | 8/2015 | Gerhuer |
| 2017/0005318 A1 | 1/2017 | Otohata |
| 2018/0070484 A1 | 3/2018 | Mundell et al. |
| 2019/0131663 A1 | 5/2019 | Ardisana, II et al. |

FOREIGN PATENT DOCUMENTS

| | | |
|---|---|---|
| CN | 1890824 | 1/2007 |
| CN | 101523656 | 9/2009 |
| CN | 103165934 | 6/2013 |
| CN | 105765765 | 7/2016 |
| CN | 111247684 A | 6/2020 |
| CN | 111295795 A | 6/2020 |
| JP | 2002289160 A | 10/2002 |
| KR | 20120122860 | 11/2012 |
| KR | 20130065289 | 6/2013 |
| KR | 102458158 B1 | 10/2022 |
| WO | WO-2019089797 A1 | 5/2019 |
| WO | WO-2019089814 A1 | 5/2019 |

OTHER PUBLICATIONS

"U.S. Appl. No. 16/142,885, Response filed Jun. 22, 2020 to Non Final Office Action dated Mar. 20, 2020", 10 pgs.
"International Application Serial No. PCT/US2018/058513, International Preliminary Report on Patentability dated May 14, 2020", 8 pgs.
"International Application Serial No. PCT/US2018/058536, International Preliminary Report on Patentability dated May 14, 2020", 8 pgs.
"International Application Serial No. PCT/US2018/058536, International Search Report dated Feb. 25, 2019", 5 pgs.
"International Application Serial No. PCT/US2018/058536, Written Opinion dated Feb. 25, 2019", 6 pgs.
"International Application Serial No. PCT/US2018/058513, International Search Report dated Apr. 23, 2019", 4 pgs.
"International Application Serial No. PCT/US2018/058513, Written Opinion dated Apr. 23, 2019", 6 pgs.
U.S. Appl. No. 16/142,885, filed Sep. 26, 2018, Battery Pack Protection Circuit Module.
"U.S. Appl. No. 16/142,885, Final Office Action dated Feb. 11, 2021", 12 pgs.
"U.S. Appl. No. 16/142,885, Notice of Non-Compliant Amendment dated Feb. 5, 2021", 2 pgs.
"U.S. Appl. No. 16/142,885, Response filed Feb. 1, 2021 to Final Office Action dated Sep. 1, 2020", 10 pgs.
"European Application Serial No. 18804205.5, Response to Communication pursuant to Rules 161(1) and 162 EPC filed Dec. 15, 2020", 23 pgs.
"MPEP 2144.04: Legal Precedent as Source of Supporting Rational [R-10.2019]", (2019), 4 pgs.
"U.S. Appl. No. 16/142,885, Final Office Action dated Sep. 1, 2020", 12 pgs.
"European Application Serial No. 18811405.2, Communication Pursuant to Article 94(3) EPC dated Feb. 9, 2021", 5 pgs.
"European Application Serial No. 18811405.2, Response filed Jun. 9, 2021 to Communication Pursuant to Article 94(3) EPC dated Feb. 9, 2021", 23 pgs.
"U.S. Appl. No. 16/142,885, Non Final Office Action dated Feb. 1, 2022", 12 pgs.
"U.S. Appl. No. 16/142,885, Appeal Brief filed Jan. 12, 2022", 16 pgs.
"Korean Application Serial No. 10-2020-7015244, Notice of Preliminary Rejection dated Dec. 23, 2021", With English translation, 15 pgs.
"Korean Application Serial No. 10-2020-7015171, Notice of Preliminary Rejection dated Dec. 23, 2021", With English machine translation, 35 pgs.
"U.S. Appl. No. 16/142,885, Notice of Allowance dated Jul. 26, 2022", 7 pgs.
"U.S. Appl. No. 16/142,885, Response filed Jul. 1, 2022 to Non Final Office Action dated Feb. 1, 2022", 11 pgs.
"Chinese Application Serial No. 201880067365.2, Office Action dated Oct. 26, 2022", w English Translation, 14 pgs.
"Chinese Application Serial No. 201880070750.2, Office Action dated Nov. 1, 2022", w English Translation, 14 pgs.
"U.S. Appl. No. 18/059,203, Preliminary Amendment filed Jan. 10, 2023", 7 pgs.

* cited by examiner

NESTED PCM BATTERY PACK

PRIORITY CLAIM

This application claims the benefit of priority of U.S. Provisional Application Ser. No. 62/579,615, filed on Oct. 31, 2017, this application also claims the benefit of U.S. Provisional Application 62/579,604, filed on Oct. 31, 2017 which are hereby incorporated by reference herein in their entirety.

BACKGROUND

A common mechanism for providing battery power to portable electronic devices is by use of modular secondary battery packs. Such battery packs often employ rechargeable lithium-ion based battery cells, such as lithium-ion polymer battery cells, also known as Li-Poly, Li-Pol or LiPo cells.

A protection circuit module (PCM) is usually included in the battery pack, being connected to the battery cell by a pair of electrodes to perform protective functions with respect to operation of the battery cell. Typical functions of the PCM include preventing overcharge, preventing over discharge, and preventing over-current of the battery cell.

In many electronic devices, including mobile devices such as mobile phones and wearable devices such as smart glasses, space is at a premium, demanding increasing space-saving in battery pack design. Space-saving in battery packs can, however, come at a cost when the available space/volume for PCM component are reduced to suboptimal levels.

BRIEF DESCRIPTION OF THE DRAWINGS

Various ones of the appended drawings merely illustrate example embodiments of the present disclosure and cannot be considered as limiting its scope. To facilitate collation of numbered items in the description to the drawings, the first digit of each numbered item corresponds to the figure in which that item first appears. In the drawings:

FIG. 1A is a schematic three-dimensional view of an existing battery pack, in which a PCM insulation cover is removed for clarity of view. FIG. 1B is a partial cross-section, on an enlarged scale, of the existing battery pack of FIG. 1A.

The headings provided herein are merely for convenience and do not necessarily affect the scope or meaning of the terms used.

TECHNICAL BACKGROUND

Figure 1A:
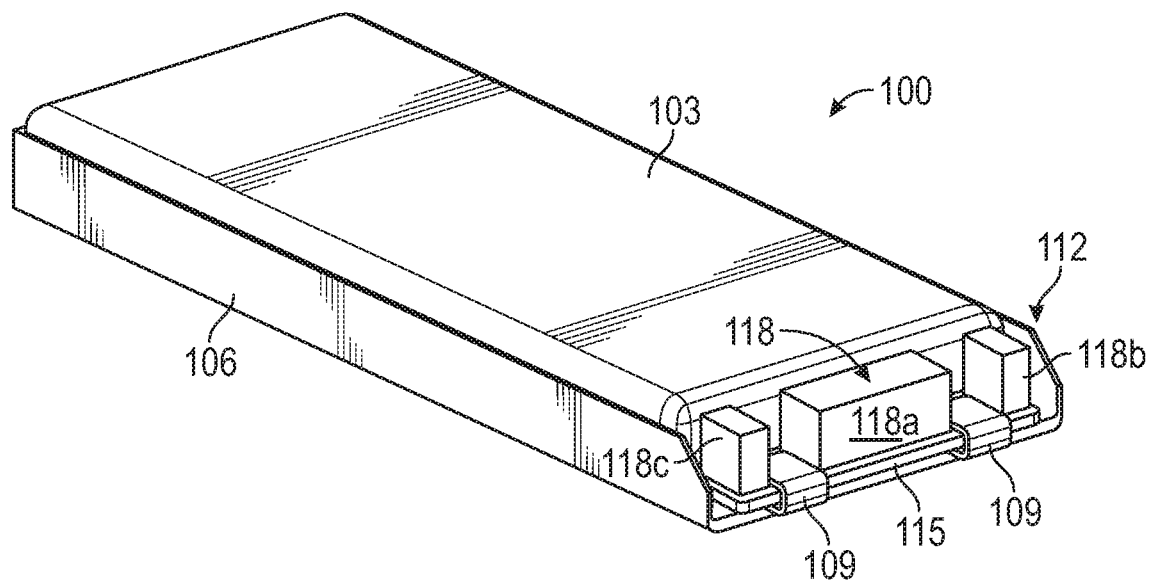
FIGS. 1A and 1B shows a battery pack according to existing structural arrangements.
Figure 1B:
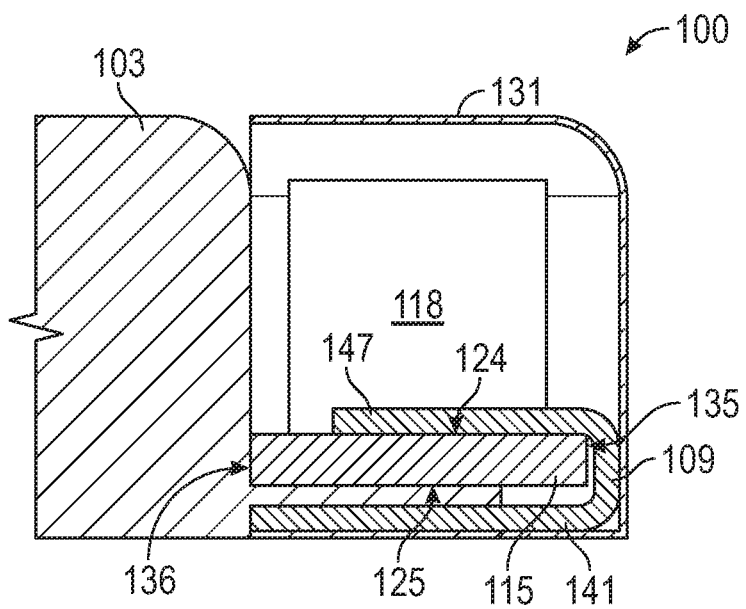

FIGS. 1A and 1B show an example of an existing battery pack structure. The conventional battery pack 100 of FIG. 1A includes a single lithium polymer battery cell 103 coupled to a safety circuit in the form of a protection circuit module (PCM) 112. As mentioned previously, the PCM 112 provides power control functionality to the battery cell 103, e.g. for safety purposes. Typically, the PCM prevents overcharge, over-discharge, and/or overcurrent in the battery cell 103. The PCM 112 is connected to the battery cell 103 by a pair of electrodes 109 that project from the battery cell 103. In conventional fashion, the pair of electrodes 109 are terminals of the battery cell 103, consisting of a cathode and an anode.

The PCM 112 comprises a printed circuit board or protection circuit board (PCB) 115 and a plurality of PCM components mounted on the PCB 115, the available volume for location of PCM components on the PCB 115 being indicated in the drawings by PCM block 118. It will be appreciated that the PCB 115 comprises a rectangular substrate carrying an integrated protection circuit thereon for connection to the PCM components and to the battery electrodes 109. To facilitate modular use of the battery pack 100, the assembly consisting of the battery cell 103 and the PCM 112 is housed in a casing 106, part of which provides insulation 131 covering or the PCM 112. For clarity of view, the insulation 131 and its analogs are omitted from some of the schematic views with respect to a number of illustrated example embodiments.

Having a relatively thin, elongate rectangular shape, the PCB 115 has a pair of substantially rectangular major outer faces which are substantially parallel to one another and which face in opposite outward directions. In FIG. 1B, these opposite major faces are designated as a top face 124 and a bottom face 125. Note that in this description, reference to the top and bottom faces do not indicate a particular orientation or spatial attribute of the respective faces, but is instead used as arbitrary designations to distinguish between these two faces in description.

The top and bottom faces 124, 125 are connected by a peripheral edge face that extends transversely between them.

The edge face includes a pair of end edge faces at the longitudinal end edges of the PCB 115, and a pair of side edge faces 135, 136 (FIG. 1B) at the lateral side edges of the PCB 115. For clarity, the side edge faces (best seen in FIG. 1B) are designated as a front edge face 135 furthest from the battery cell 103, and a rear edge face 136 closest to the battery cell 103. The PCB 115 is oriented such that a widthwise dimension of the PCB 115 (i.e., the dimension extending between the side edge faces 135, 136) is substantially parallel to a lengthwise direction of the battery cell 103. A lengthwise direction of the PCB 115 (i.e., the dimension of the PCB 115 that extends between its end edges) is oriented transversely to the lengthwise direction of the battery cell 103. The thickness dimension of the PCB 115 (i.e., that dimension of the PCB 115 that extends between the top face 124 and the bottom face 125), being normal to the widthwise dimension, is oriented transversely to the lengthwise direction of the battery cell 103.

As seen in FIGS. 1A and 1B, connections of the respective electrodes 109 to the PCB 115 are in the existing battery back 100 located on the top face 124 of the PCB 115. Each electrode comprises a metal tab 141 that projects longitudinally (relatively to the lengthwise direction of the battery cell 103) from the battery cell 103, passes beneath the bottom face 125 of the PCB 115, and is bent 180o to fold over into contact with the top face 124 at respective terminal end portions 147. The electrodes 109 are typically soldered to respective terminal pads provided on the PCB 115.

Location of the electrode contacts on the top face 124 interrupts the available space for the PCM block 118, so that the cumulative available volume for PCM components on the PCB top face 124 is given by the sum of three separate PCM sub-blocks, indicated as 118a, 118b, and 118c.

DETAILED DESCRIPTION

The description that follows includes devices, systems, methods, techniques, instruction sequences, and computing machine program products that embody illustrative embodiments of the disclosure. In the following description, for the purposes of explanation, numerous specific details are set forth in order to provide an understanding of various embodiments of the disclosed subject matter. It will be evident, however, to those skilled in the art, that embodiments of the disclosed subject matter may be practiced without these specific details. In general, well-known instruction instances, protocols, structures, and techniques are not necessarily shown in detail.

One aspect of the disclosure provides for a battery pack comprising two batteries sharing a single PCM. This provides an overall more compact protection circuit packaging, allowing additional system volume to be allocated to additional battery capacity or allows for a smaller, slimmer design by freeing up space for the same battery capacity.

The electrodes of the pair of battery cells of the battery pack may all be connected to a single, common PCB of the PCM. In some embodiments, the batteries are elongate and are longitudinally aligned with a spacing between adjacent ends of the batteries, the common PCM being located in the spacing between the batteries. The PCB is in some embodiments oriented "vertically" between the two batteries, by which is meant that the thickness dimension of the PCB (i.e., that dimension of the PCB which extends between its major outer faces) extends in the lengthwise direction of the batteries. Worded differently, the widthwise dimension of the PCB stands upright between the batteries, when the battery pack is seen in side view.

In some such embodiments, the respective pairs of electrodes may be connected to opposite major faces of the PCB, so that each of the major outer faces of the PCB is interrupted by a respective pair of electrode connections. In other embodiments, all four electrodes are connected to a single one of the pair of major faces, so that the other one of the major faces is uninterrupted by any electrode connection and is substantially entirely available for the placement of PCM components thereon.

In yet further embodiments, the electrodes of at least one of the batteries may be connected to the edge face of the PCB, so that both of the major faces are uninterrupted by any electrode connection and are substantially wholly available for receiving PCM components thereon. In a particular example embodiment, the PCB has an upright orientation (as described previously), with the electrodes of the respective batteries being connected to opposite side edge faces of the PCB.

A number of specific example embodiments will now be described in greater detail with reference to the FIGS. 2-7D. For ease of understanding, the same reference numerals are used for indicating corresponding parts or elements in FIG. 1 and in FIGS. 2-7D, even when there are in some instances differences between the specifics of the corresponding parts or elements.

Figure 2:
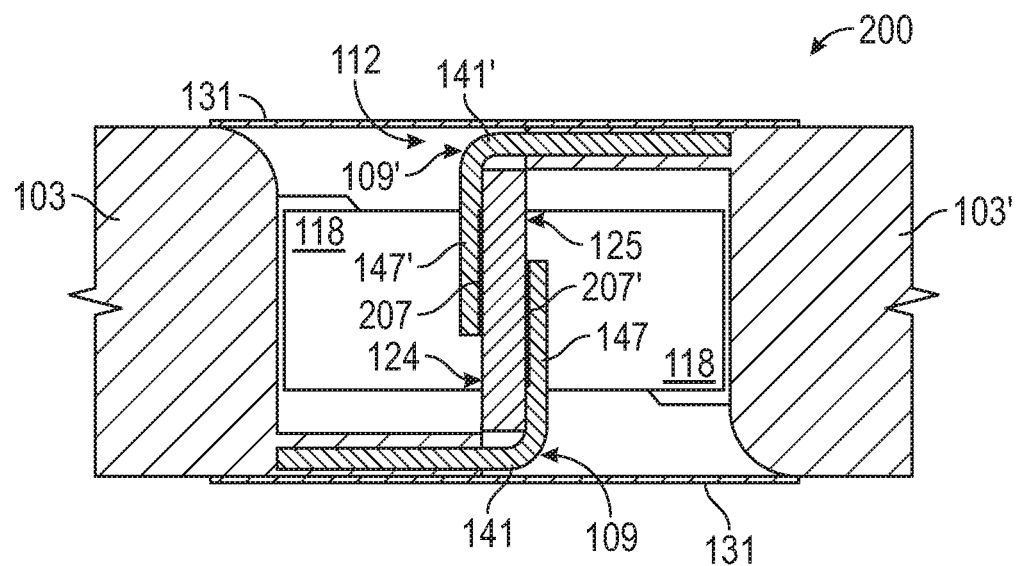
FIG. 2 is a cross-sectional view according to an example embodiment in which the battery pack comprises a pair of batteries sharing a PCM in common, with the electrodes of the respective batteries being connected to opposite major faces of a protection circuit board (PCB) forming part of the PCM.

FIG. 2 shows one example embodiment of a dual-cell battery pack 200 with a nested PCM arrangement. The battery pack 200 includes a pair of lithium polymer battery cells 103, 103' identical to that described with reference to FIG. 1. Note that, in this description, the term battery refers to a battery cell together with its electrodes. As can best be seen in FIG. 3, the battery cells 103, 103' are longitudinally aligned, in that their lengthwise dimensions are parallel and in line with one another, the battery cells 103, 103' lying substantially in a common plane. The battery cells 103, 103' are arranged end-to-end, with a longitudinal spacing between the adjacent ends of the batteries 103, 103'. Returning to FIG. 2, it can be seen that a common, shared PCM 112 is located within the longitudinal spacing between the battery cell 103, with respective electrodes 109, 109' being connected to a single PCB 115 forming part of the common PCM 112.

The PCB 115 has an "upright," orientation in which the widthwise direction of the PCB 115 (i.e., that dimension of the PCB 115 that extends between its opposite lateral side edges) is normal to the lengthwise direction of the aligned battery cells 103, 103'. In other words, the thickness dimension of the PCB 115 (i.e., that dimension of the PCB 115 that extends between the opposite major outer faces 124, 125) extends in the lengthwise direction of the aligned battery cells 103, 103'. In the example embodiment of FIG. 2, the electrode 109 of a first one of the battery cells 103 is connected to the bottom face 125 of the PCB 115, while the electrode 109' of a second one of the battery cells 103' is connected to the top face 124 of the PCB 115.

Terminal end portions 147, 147' of the respective electrodes 109, 109' are soldered or welded to the corresponding exposed gold contact pads 207, 207' are provided on the opposite major faces 124, 125 of the PCB 115. As can be seen in FIG. 2, the terminal end portion 147, 147' of each battery cell 103, 103' is connected to the major face of the PCB 115 furthest therefrom. The battery cells 103, 103' are inverted, so that their respective electrodes 109, 109' are transversely misaligned relative to the longitudinal direction of the battery pack 200. Thus, the electrode tab 141 of the electrode 109 of the first battery cell 103 projects longitudinally from the battery cell 103, extends past a respective side edge of the PCB 115, and thereafter bends substantially 90° such that its terminal end portion 147 lies flat against the corresponding contact pad 207' provided on the bottom face 125 of the PCB 115. Each electrode 109' of the second battery cell 103' is similarly arranged, except that its electrode tab 141' extends past the opposite side edge of the PCB 115, and its terminal end portion 147' is soldered or welded to the contact pad 207 of the opposite major face 124 of the PCB 115.

Electronic PCM components 118 are mounted on both of the major faces 124, 125 of the PCB 115. As can best be seen in FIG. 3, the available space for the PCM components 118 is on both major faces 124, 125 interrupted by the respective electrodes 109, 109', so that the PCM block is on both faces separated into three sub-blocks, similar to the arrangement of the FIG. 1A. In this example embodiment, the PCM 112 provides a single protection circuit to which both battery cells 103, 103' are connected by their respective electrodes 109, 109', so that the PCM components 118 on the opposite faces 124, 125 of the PCB 115 form part of a single, common, protection circuit. In other embodiments, the PCB 115 and PCM components 118 may be configured to provide separate protection circuits to separately control operation of the respective battery cells 103, 103'.

Figure 4:
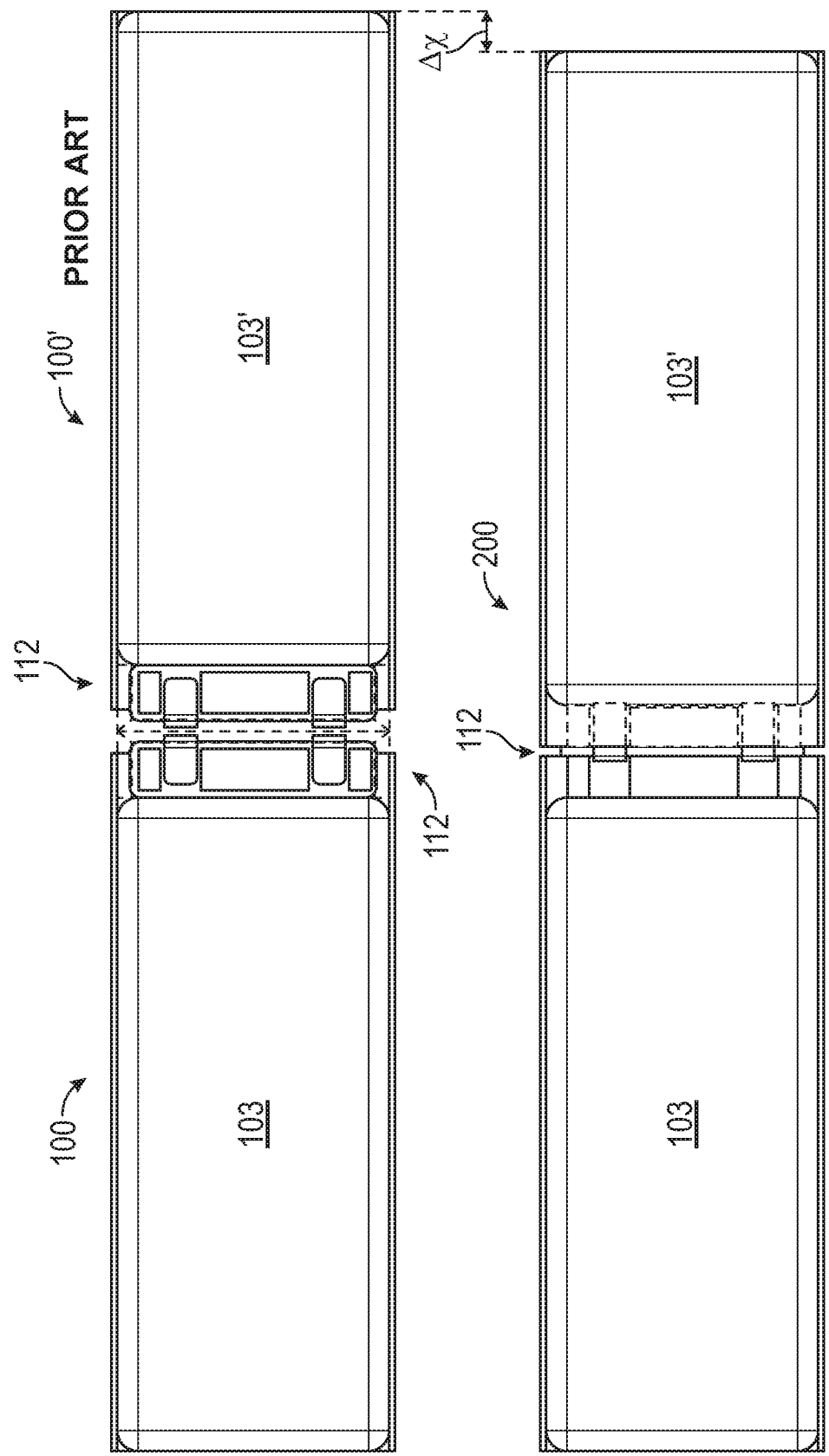
FIG. 4 is a schematic top view comparing the respective lengths of, on the one hand, a nested dual-cell battery pack analogous to that exemplified with reference to FIGS. 2 and 3, and, on the other hand, a pair of identical battery cells with separate respective PCMs, consistent with the existing configuration described with reference to FIGS. 1A and 1B.

It is a benefit of the nested PCM arrangement of the battery pack 200 that it provides for space saving by reducing the length of the battery pack 200 without compromising either battery capacity or available space for PCM components 118. FIG. 4 shows a comparison of, on the one hand, two of the earlier-described conventional battery packs 100, 100' arranged in an end to end configuration, and, on the other hand, the battery pack 200 with a common PCM in a nested configuration. Note that the respective battery cells 103, 103' of both of the illustrative configurations are identical, yet the overall length of the nested battery pack 200 is smaller than that of the conventional stack, as represented by the length difference Δx. Not only does the PCM sharing of the battery back 200 thus provide for space saving, but a larger volume for PCM mounting on the PCB 115 is provided by utilizing both major faces 124, 125 of the PCB 115. Note that, in other embodiments, the space saving achieved by the described PCM nesting can be utilized to increase battery length, and thus battery capacity, without increasing the dimensional parameters of the battery stack.

Figure 5:
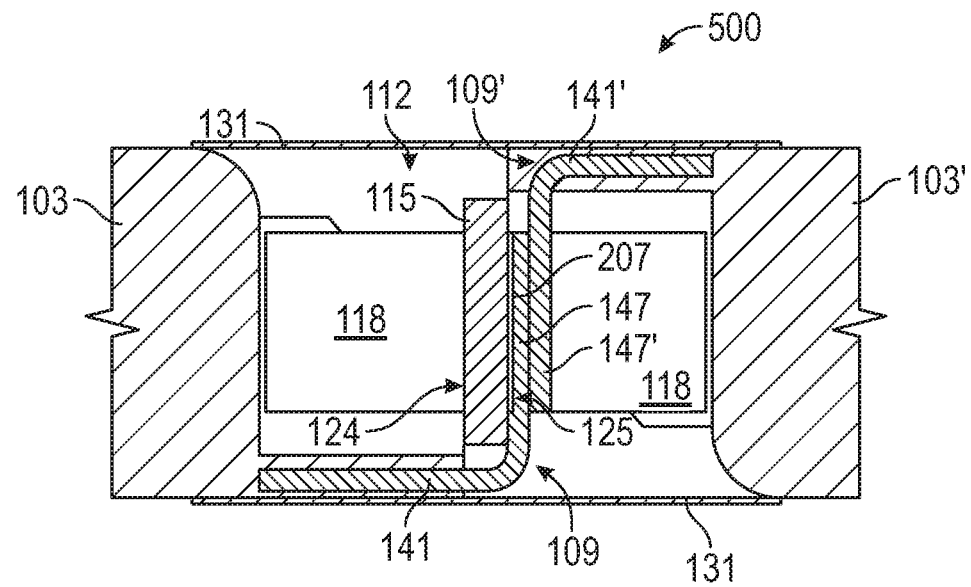
FIG. 5 is a cross-sectional view of a dual-cell battery pack according to another example embodiment of the disclosure, in which the electrodes of the respective pair of battery cells are connected to a common major face of a common PCB.

FIG. 5 shows another example embodiment of a dual cell battery pack 500 with a shared PCM arrangement. The battery pack 500 is largely similar in arrangement and configuration to the battery pack 200 described with reference to FIGS. 2-4, a major distinction being that the electrodes 109, 109' of both battery cells 103, 103' are connected to a single, common one of the major outer faces 124, 125 of the PCB 115. In this example embodiment, all of the electrodes 109, 109' are connected to the bottom face 125

In this example embodiment, the electrodes are connected to the bottom face 125 in a stacked arrangement, so that the electrodes 109 of only one of the battery cells 103, 103' are connected directly to the PCB 115, the electrodes 109' of the other battery cell being connected to the underlying electrodes 109. As can be seen in FIG. 5, the terminal end portions 147 of the electrodes 109 of the first battery cell 103 is in this example embodiment directly soldered or welded to respective exposed gold contact pads 207 on the bottom face 125, the end portions 147 of the electrode tabs 141 lying flat against the bottom face 125. The electrodes 109' of the second the battery cell 103' is connected to the electrodes 109 of the first battery cell 103. In particular, the terminal end portions 147' of the electrode tabs 141' of the second battery cell 103' lie flat against the end portions 147 of the first battery cell 103, being soldered or welded thereto to provide a conductive coupling of the second battery cell's electrodes 109' to the protection circuit of the PCM 112.

Note that it is an advantage of the PCM arrangement of the battery pack 500 that the top face 124 of the PCB 115 is uninterrupted by any electrode connections, and is available in its entirety for the placement of PCM components 118 thereon. Thus, the battery pack 500 has a greater PCM block volume than the battery pack 200 described with reference to FIGS. 2-4. This may be leveraged in design of PCM component placement to achieve further reduction in the overall length of the battery pack 500, e.g., by reducing the height by which the PCM block projects outwardly from the major faces 124, 125.

Figure 6:
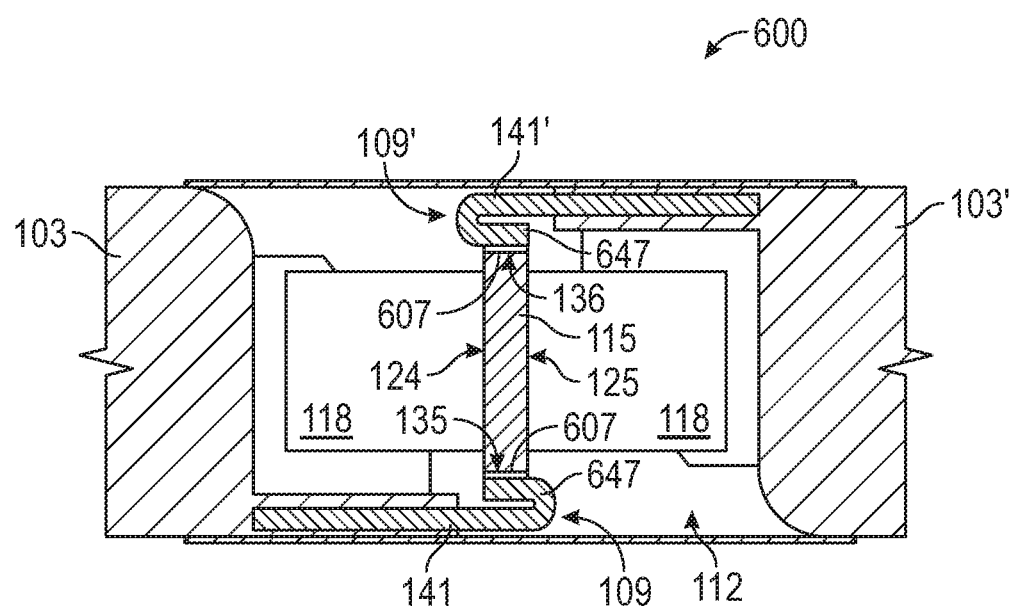
FIG. 6 is a cross-sectional view of a dual cell battery pack according to a further example embodiment of the disclosure, in which the electrodes of a respective pair of battery cells are connected to an edge face of the common PCB.

FIG. 6 shows yet a further example embodiment of a dual-cell battery pack 600 with a shared PCM 112. The battery pack 600 is generally similar in configuration and arrangement to the example embodiment described with reference to FIGS. 2-4, a major distinction being that in the example embodiment of FIG. 6, electrodes 109, 109' of respective battery cells 103, 103' are connected to the edge face of the PCB 115. In particular, the respective battery cells 103, 103' are connected to different respective side edge faces 135, 136, with the PCB 115 having an "upright" orientation in which the opposite major faces 124, 125 of the PCB 115 face towards the respective battery cells 103, 103' between which the PCM 112 is sandwiched.

As can be seen in FIG. 6, the electrodes 109 of the first battery cell 103 is connected to a first one of the side edge faces 135, with the electrodes 109' of the second battery cell 103' being connected to the opposite side edge face 136. Turning briefly to FIG. 7D (which shows the PCM 112 during an intermediate stage of manufacture, as will be described later herein) it can be seen that each electrode 109 includes an elongated connective portion in the form of an electrode tab 141 of similar width to that described in the previous embodiments, and a widened terminal end portion 647. Note again that, as can be seen in FIG. 7D, the peripherally extending edge face of the PCB 115 consists of a pair of opposite side edge faces 135, 136 (only one of which can be seen in FIG. 7D) and, transverse thereto, a pair of opposite end edge faces 706 (only one of which can be seen in FIG. 7D).

The end portion 647 of each electrode 109 is connected by soldering or welding to a respective somewhat wider edge-mounted contact pad 607. In this example embodiment, the contact pads 607 are provided by metal surfaces (in this embodiment, gold-plated surfaces) on the respective side edge faces 135, 136, connection of the electrodes 109 thereto being achieved by solder joint attachment of the terminal end portions 647 to the respective contact pads 607. In other embodiments, the electrodes 109 can be welded to the exposed gold pads 607. The contact pads 607 are conductively coupled to the integrated circuit of the PCB 115. In this example embodiment, the increased width of the terminal end portions 647 and contact pads 607 are selected such that the contact surface between the terminal end portions 647 and the contact pads 607 are at least as great as the corresponding contact surface between the conventionally structured electrodes 109 and the PCB 115 of existing battery packs, such as the battery pack 100 described with reference to FIG. 1.

Returning now to FIG. 6, it can be seen that the electrode tabs 141, 141' are folded. Each electrode tab 141, 141' thus projects longitudinally from the corresponding battery cell 103, extending past the corresponding side edge face 135, 136 of the PCB 115, whereafter it folds back on itself by about 180° towards its soldered connection to the corresponding edge-mounted contact pad 607.

Due to edge-mounting of the electrode connections, both major faces 124, 125 of the battery pack 600 are substantially free of intrusion by any of the electrodes 109, and are substantially wholly available for the placement of PCM components 118. As discussed previously, the additional free area on the flat major faces 124, 125 can be optimized for allowing a more compact PCM 112, while achieving the previously discussed space-saving benefits arising from using a shared PCB 115 for the staggered battery cells 103, 103'. Instead, or in addition, the additional volume available for PCM components can be utilized to provide improved PCM functionality and/or reliability.

FIGS. 7A-7D are respective views of an intermediate step in the manufacturing of the respectively described dual cell battery packs. In each of the described embodiments, the respective electrodes 109, 109' are fixedly attached to the PCB 115 while the electrodes 109, 109' are in an unbent or pre-final condition, after which the PCB 115 is rotated into its final orientation, in the process bending or folding the electrodes 109, 109' into their final positions shown in FIGS. 2, 5, and 6 respectively. These different embodiments will now briefly be described separately.

Figure 3:
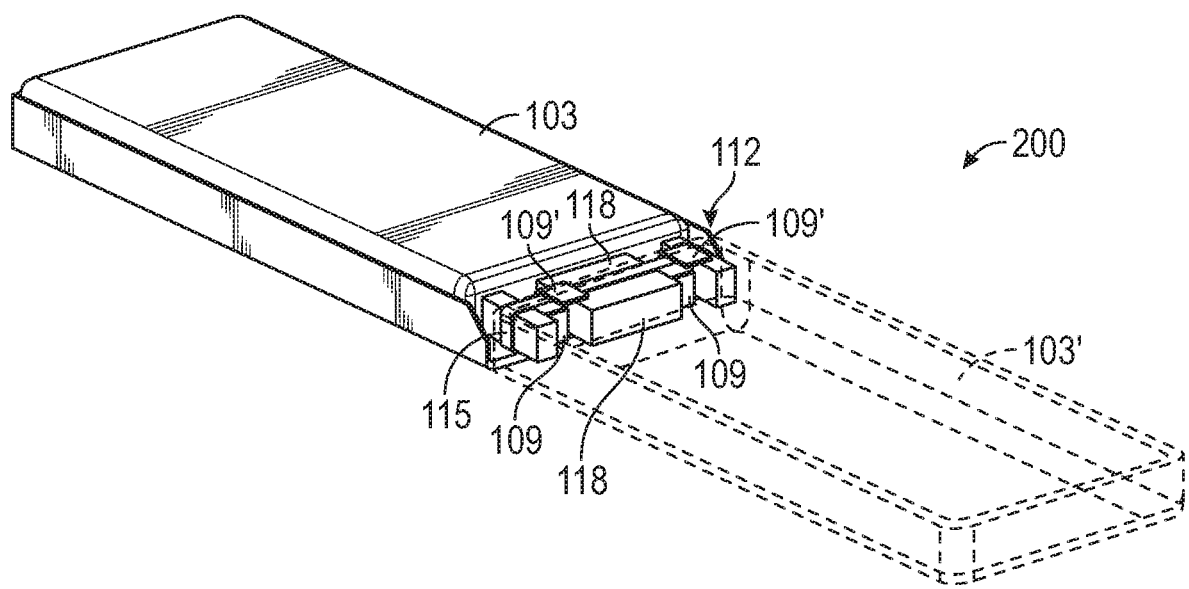
FIG. 3 is a schematic three-dimensional view of a multi-cell battery pack according to the example embodiment of FIG. 2, with one of the battery cells being shown in broken lines to afford a clearer view of the single PCM shared by the pair of battery cells.
Figure 7A:
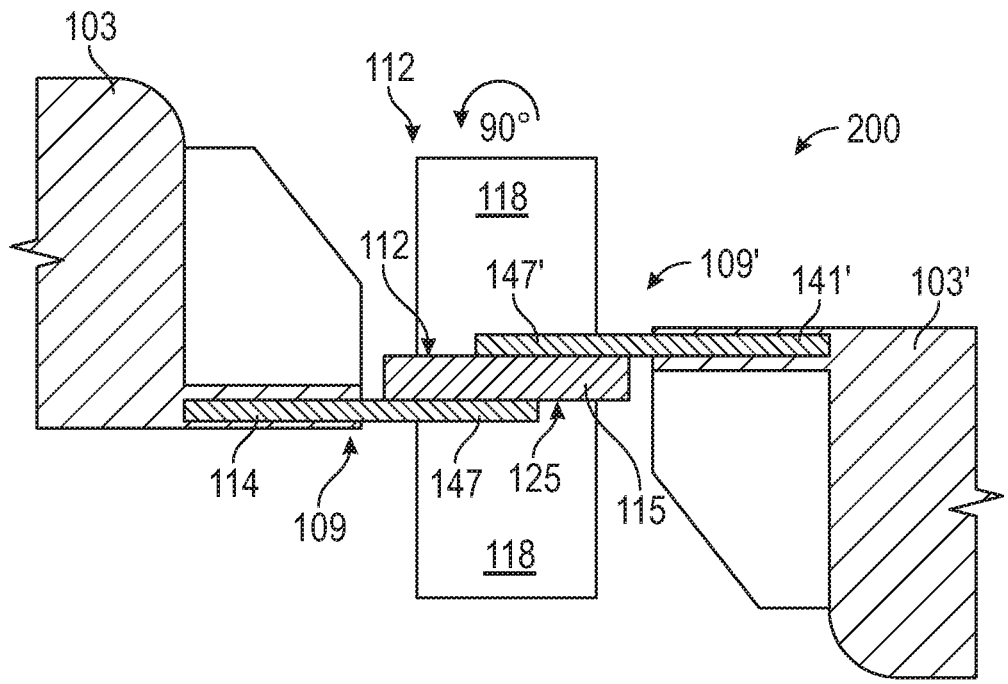
FIG. 7A is a partial cross-sectional view of a battery pack according to the example embodiment of FIGS. 2-4 in an intermediate stage during manufacture of the battery pack, according to one example embodiment.

FIG. 7A shows an intermediate step in the manufacturing of the battery pack 200 described and exemplified with reference to FIGS. 2-4. In a first step, PCM components 118 are connected to both major faces 124, 125 of the PCB 115 such as to leave access to the respective contact pads 207, 207' (FIG. 2) on the opposite major faces. Thereafter, while the respective electrode tabs 141, 141' are in a rectilinear, unbent condition, the respective terminal end portions 147, 147' are soldered to the contact pads 207, 207' on the respective major faces 124, 125. Because the electrode tabs 141, 141' project longitudinally from the battery cells 103, 103', the PCB 115 is oriented in a "horizontal" position during attachment, the widthwise dimension of the PCB 115 being longitudinally aligned with the battery cells 103, 103'. After such connection, the battery pack 200 is in the condition shown in FIG. 7A.

Thereafter, the PCB 115 is rotated through 90° (being rotated counterclockwise in the orientation seen in FIG. 7A) into the position shown in FIG. 2, in which the widthwise dimension of the PCB 115 is substantially normal to the lengthwise direction of the aligned batteries cells 103, 103'. Such rotation of the PCM 112 is in this embodiment achieved by folding the respective electrode tabs 141, 141' through about 90° to create the respective bends or kinks therein, as shown in FIG. 2. Finally, PCM insulation 131 is attached on opposite sides of the assembly, covering the longitudinal gap between the battery cells 103, 103' within which the PCM 112 is located.

It will be appreciated that a benefit of the described method of manufacturing is that access to the PCB 115 and the electrode end portions 147, 147' is easier in the position shown in FIG. 7A than in the final position of FIG. 2. This is in part due to the fact that the longitudinal spacing between the adjacent ends of the battery cells 103, 103' decreases when the PCB 115 and the attached electrode end portions 147, 147' are rotated into their final positions. The exemplified method of manufacturing thus promotes manufacturing quality and requires less expensive tooling than would be the case if the electrodes 109, 109' were to be attached to the PCB 115 in their final shapes and positions.

Figure 7B:
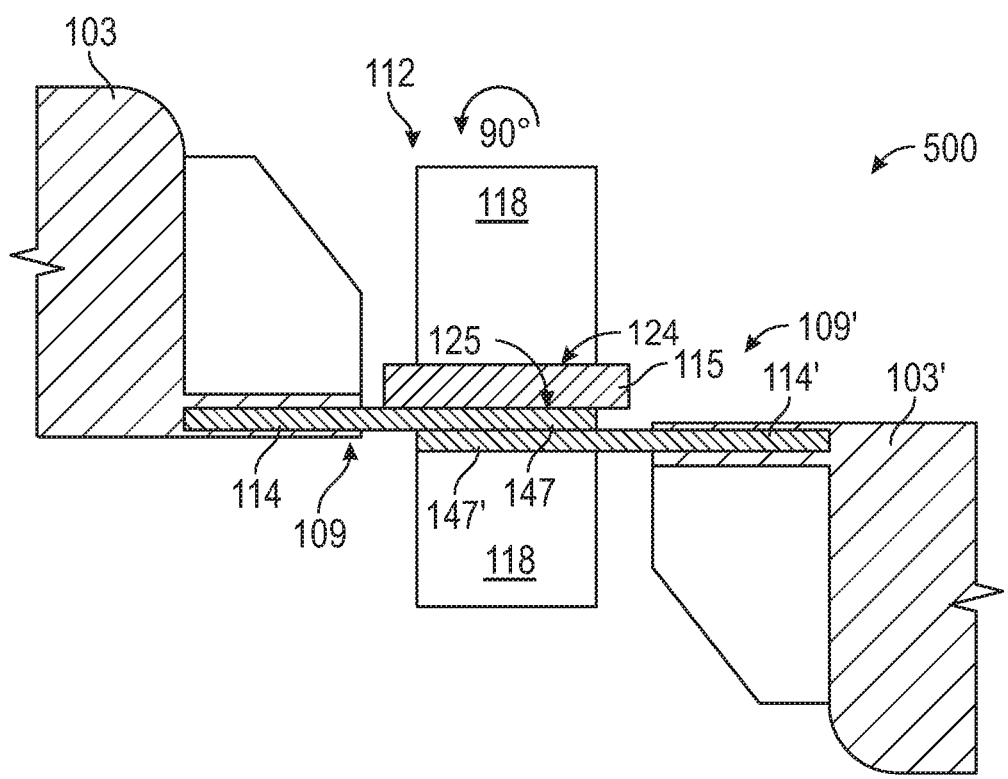
FIG. 7B is a partial cross-sectional view of a battery pack according to the example embodiment of FIG. 5, in an intermediate stage during manufacture of the battery pack, according to an example embodiment.

FIG. 7B is analogous to FIG. 7A, in that it shows an intermediate step in the manufacturing of the battery pack 500 described and exemplified with reference to FIG. 5. The above description with reference to FIG. 7A applies analogously to the steps for manufacturing the battery pack 500 consistent with FIG. 7B. A major distinction, however, is that the respective end portions 147, 147' of the electrodes 109, 109' are connected in common to a single one of the major faces of the PCB 115, in this description indicated as the bottom face 125.

Thus, with the PCB 115 in the orientation shown in FIG. 7B, in which its width is aligned with the lengthwise directions of the electrode tabs 114, 114', the end portions 147 of the electrode tabs 114 of the first battery 103 are soldered to respective contact pads 207 on the bottom face 125 of the PCB 115. Thereafter, the end portions 147' of the electrode tabs 114' of the second battery 103' are soldered to the end portions 147 of the first battery 103. The remainder of the manufacturing method proceeds as previously, with the PCM 112 being rotated counterclockwise through about 90° into the final position shown in FIG. 5, in the process bending or folding the respective electrode tabs 114, 114' through about 90°.

Figure 7C:
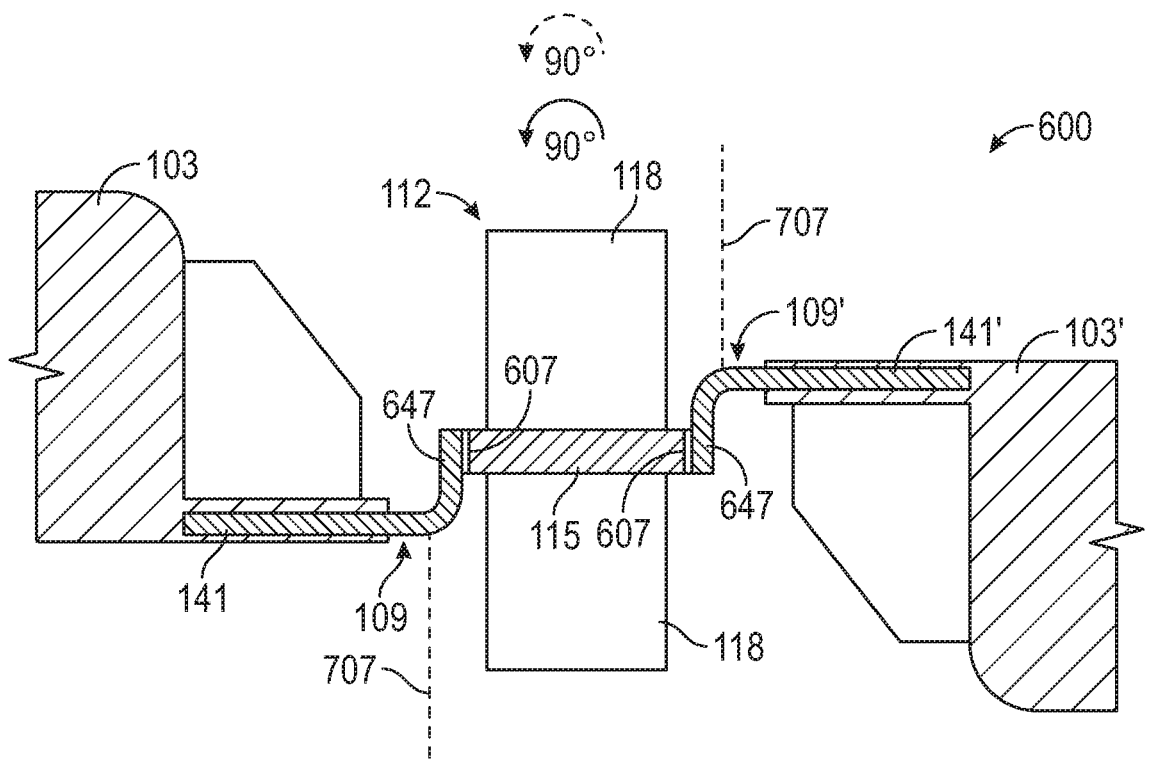
FIG. 7C is a partial cross-sectional view of a battery pack according to the example embodiment of FIG. 6, in an intermediate stage during manufacture of the battery pack, according to an example embodiment.
Figure 7D:
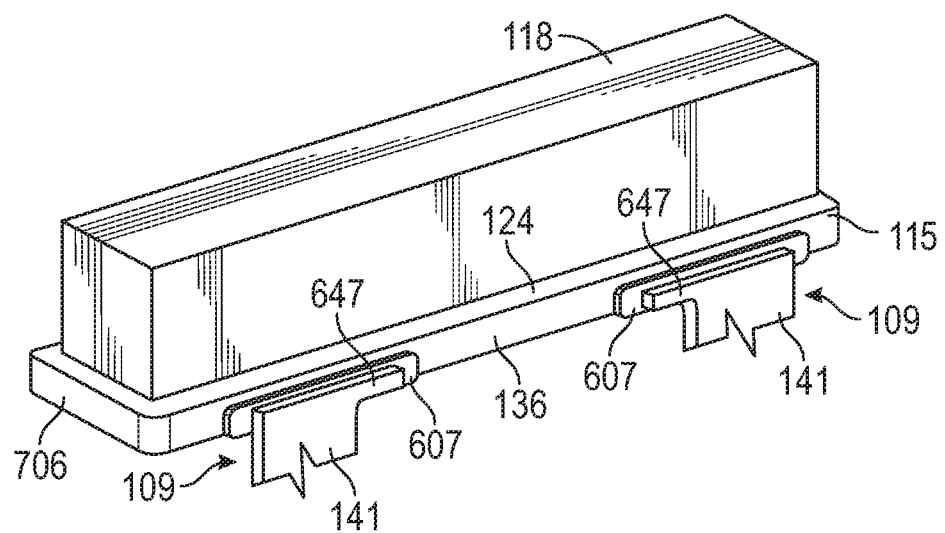
FIG. 7D is an isolated schematic three-dimensional view of a part of the PCM of the example embodiment described with reference to FIGS. 6 and 7C, showing details of edge-mounted contact pads and complementary electrode end portions connected thereto.

Finally, FIGS. 7C and 7D illustrate an intermediate step in the manufacturing of the battery pack 600 such as that described previously with reference to FIG. 6. Again, the manufacturing process is analogous to that described previously with reference to FIGS. 7A and 7B.

In the manufacturing of the battery pack 600, however, the respective end portions 647 of the electrode tabs 141, 141' are soldered to the edge-mounted contact pads 607 while the electrode tabs 141, 141' are rectilinear and extend in the directions indicated by dotted lines 707 in FIG. 7C. In this position, it will be appreciated that the PCB 115 is oriented relative to the battery cells 103, 103' such that its widthwise dimension is transverse to the lengthwise direction of the battery cells 103, 103'.

Thereafter, the PCM 112 is rotated through 180° into its final position shown in FIG. 6. This is achieved by folding the ends of the electrode tabs 141, 141' back on itself so that the electrode end portion 647, 647' point back towards the battery cell 103 from which it projects. To achieve this 180° fold in the electrode tabs 141, 141', the electrode tabs are in this example given two separate closely spaced 90° folds or angles. It will be appreciated that thus bending the electrode tabs 141, 141' draws the battery cells 103, 103' closer together, and rotates the PCM blocks 118 into their final positions shown in FIG. 6.

FIG. 7D shows a schematic three-dimensional view of the end portions 647 of the electrodes 109 of the first battery cell 103 welded to their corresponding edge-mounted contact pads 607, before folding of the electrode tabs 141 commences.

Overview

From the above-described example embodiments, it will be seen that one aspect of the disclosure provides for a battery pack comprising:

a pair of physically separate electrochemical batteries, each battery having a respective pair of electrodes projecting therefrom; and a protection circuit module (PCM) that is electrically coupled to both of the pair of batteries and that is configured to control one or more functions of the batteries, the PCM comprising:

a protective circuit board (PCB), electric coupling of the pair of batteries to the PCM being via connection of the respective electrodes of both of the pair of batteries to the PCB; and electronic PCM components mounted on the PCB.

In some embodiments, the batteries are elongate modular units that are longitudinally aligned with a longitudinal spacing between adjacent ends of the batteries, the PCM being located within the longitudinal spacing between the batteries. The PCB in some such embodiments has a pair of parallel major faces and a peripheral edge face extending transversely between the major faces, a thickness dimension of the PCB being defined by a transverse spacing between the parallel major faces. The PCB may be oriented such that the thickness dimension of the PCB extends in the lengthwise direction of the aligned batteries, each of the major faces of the PCB facing toward a respective one of the batteries between which the PCM is located. In some embodiments, the PCM components are mounted on both major faces of the PCB.

In some embodiments, the electrodes of a first one of the pair of batteries is connected to a first one of the major faces of the PCB, the electrodes of the second one of the pair of batteries being connected to a second, opposite one of the major faces of the PCB. In one such embodiment, for each of the pair of batteries, the electrodes of the battery is connected to the major face of the PCB that is furthest from the battery, facing away therefrom. The respective pairs of electrodes may extend from the respective batteries past opposite side edges of the PCB, the side edges of the PCB extending transversely to the lengthwise direction of the aligned batteries.

In other embodiments, connection of the electrodes to the PCB is such that a first one of the pair of major faces of the PCB is free of electrode connections, such that substantially the entirety of the first major face of the PCB is available for the placement of PCM components. Both pairs of electrodes may for example be connected to a second one of the pair of major faces, opposite to the first major face. In one such embodiment, the pairs of electrodes are connected to the PCB in a stacked configuration in which respective end portions of a first pair of electrodes lie flat against the second major face, and respective end portions of a second pair of electrodes lie flat against the corresponding end portions of the first pair of electrodes.

In yet further embodiments, at least one of the pairs of electrodes is connected to the edge face of the PCB. In some embodiments, both of the pairs of electrodes are connected to the edge face of the PCB. The edge face of the PCB includes a pair of side edge faces extending longitudinally along the PCB on opposite sides thereof, the side edge faces extending transversely relative to the lengthwise direction of the aligned batteries. In some embodiments, the respective pairs of electrodes are connected to opposite side edge faces, such that the electrodes of one battery are connected to one of the side edge faces, and the electrodes of the other battery are connected to the other side edge face.

The PCB made some such embodiments include a respective electrode contact pad on the edge face for connection to a respective electrode, each electrode contact pad having a width greater than a connective portion of a corresponding electrode tab extending between the battery and the electrode contact pad. Each of the electrode contact pads on the edge face may comprise a metal surface deposited on the edge face and connected to a protection circuit integrated in the PCB.

A further aspect of the disclosure provides for a method comprising comprising, for each of a pair of physically separate electrochemical batteries, connecting a respective pair of electrodes of the battery to a protective circuit board (PCB) of a protection circuit module (PCM) that is configured to control one or more functions of the batteries, such that both of the batteries are connected to the single PCB in common. In some embodiments, the PCB has a pair of parallel major faces and a peripheral edge face extending transversely between the major faces, a thickness dimension of the PCB being defined by a transverse spacing between the parallel major faces. The method may in such cases further comprise:

positioning the PCM such that it is located within a longitudinal spacing between the pair of batteries, the pair of batteries being elongate modular units that are longitudinally aligned; and orienting the PCB such that the thickness dimension of the PCB extends in the lengthwise direction of the aligned batteries, such that each of the major faces of the PCB faces towards a respective one of the batteries between which the PCM is located.

The connecting of the electrodes to the PCB in some embodiments comprises: connecting the electrodes of a first one of the pair of batteries to a first one of the major faces of the PCB; and connecting the electrodes of a second one of the pair of batteries to a second one of the major faces of the PCB.

In other embodiments, the connecting of electrodes to the PCB comprises: connecting the electrodes of a first one of the pair of battery to a first one major face of the PCB; and connecting the electrodes of a second one of the pair of batteries to the first major face of the PCB.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the disclosed matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A battery pack comprising:
 a pair of physically separate electrochemical batteries, each battery having a respective pair of electrodes projecting therefrom; and
 a pair of protection circuits, each of which is electrically coupled to a corresponding one of the pair of batteries and is configured to control operation of the corresponding battery, the pair of protection circuits being provided by:
  a single protective circuit board (PCB), the PCB having a pair of parallel major faces and a peripheral edge face extending transversely between the major faces, each major face carrying respective electronic circuitry comprising contact pads to which the pair of electrodes of a corresponding one of the pair of batteries is permanently connected, such that the electrodes of a first one of the pair of batteries are connected to contact pads on of a first one of the pair of major faces of the PCB, the electrodes of a second one of the pair of batteries being connected to the contact pads on a second, opposite one of the pair of major faces of the PCB; and
  electronic protection circuit module (PCM) components mounted on the PCB such that the mounted PCM components of the pair of protection circuits are mutually exclusively located on opposite major faces of PCB, wherein:
   the mounted PCM components forming part of a first one of the pair of protection circuits are mounted exclusively on the first major face and are conductively coupled to the respective pair of electrodes connected to the first major face of the PCB, and
   the mounted PCM components forming part of a second one of the pair of protection circuits are mounted exclusively on the second major face and are conductively coupled to the respective pair of electrodes connected to the second major face of the PCB.

2. The battery pack of claim 1, wherein the pair of batteries are elongate modular units that are longitudinally aligned, with a longitudinal spacing between adjacent ends of the batteries, the PCB being located within the longitudinal spacing between the batteries.

3. The battery pack of claim 2, wherein:
 wherein the PCB is oriented such that a thickness dimension of the PCB, which thickness dimension is defined by a transverse spacing between the pair of parallel major faces, extends in the lengthwise direction of the aligned batteries, each of the major faces of the PCB facing toward a respective one of the batteries between which the PCB is located.

4. The battery pack of claim 3, wherein, for each of the pair of batteries, the electrodes of the battery are connected to the major face of the PCB that is furthest from that battery, facing away therefrom.

5. The battery pack of claim 4, the respective pairs of electrodes extend from the respective batteries past opposite side edges of the PCB, the side edges of the PCB extending transversely to the lengthwise direction of the aligned batteries.

* * * * *